(12) United States Patent
Poplack et al.

(10) Patent No.: US 7,739,094 B1
(45) Date of Patent: Jun. 15, 2010

(54) METHOD AND APPARATUS FOR DESIGNING AN EMULATION CHIP USING A SELECTABLE FASTPATH TOPOLOGY

(75) Inventors: Mitchell G. Poplack, San Jose, CA (US); Steven Comfort, Poughkeepsie, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 632 days.

(21) Appl. No.: 11/603,596

(22) Filed: Nov. 22, 2006

(51) Int. Cl.
*G06F 17/50* (2006.01)
*G06F 13/00* (2006.01)
(52) U.S. Cl. .................. 703/14; 703/23; 703/25; 703/27; 714/37; 326/38
(58) Field of Classification Search ............ 703/23, 703/25, 27, 14; 326/38; 714/37
See application file for complete search history.

(56) References Cited

U.S. PATENT DOCUMENTS

| | | | | |
|---|---|---|---|---|
| 5,551,013 A | * | 8/1996 | Beausoleil et al. | 703/23 |
| 2003/0083776 A1 | * | 5/2003 | Schauer et al. | 700/218 |
| 2003/0212539 A1 | * | 11/2003 | Beausoleil et al. | 703/25 |

\* cited by examiner

*Primary Examiner*—Thai Phan
(74) *Attorney, Agent, or Firm*—Moser IP Law Group

(57) ABSTRACT

A method and apparatus for designing a processor-based emulation integrated circuit (chip) having a selectable fastpath topology. Included are initially designing an N-level fastpath topology comprising a plurality of processors, then reducing the N-level fastpath topology to an M-level topology such that the performance of the topology meets a design criterion, e.g., capable of evaluating data during a time of an emulation step. In this manner, an emulator chip designer may configure the fastpath topologies without redesigning the chip layout.

18 Claims, 5 Drawing Sheets

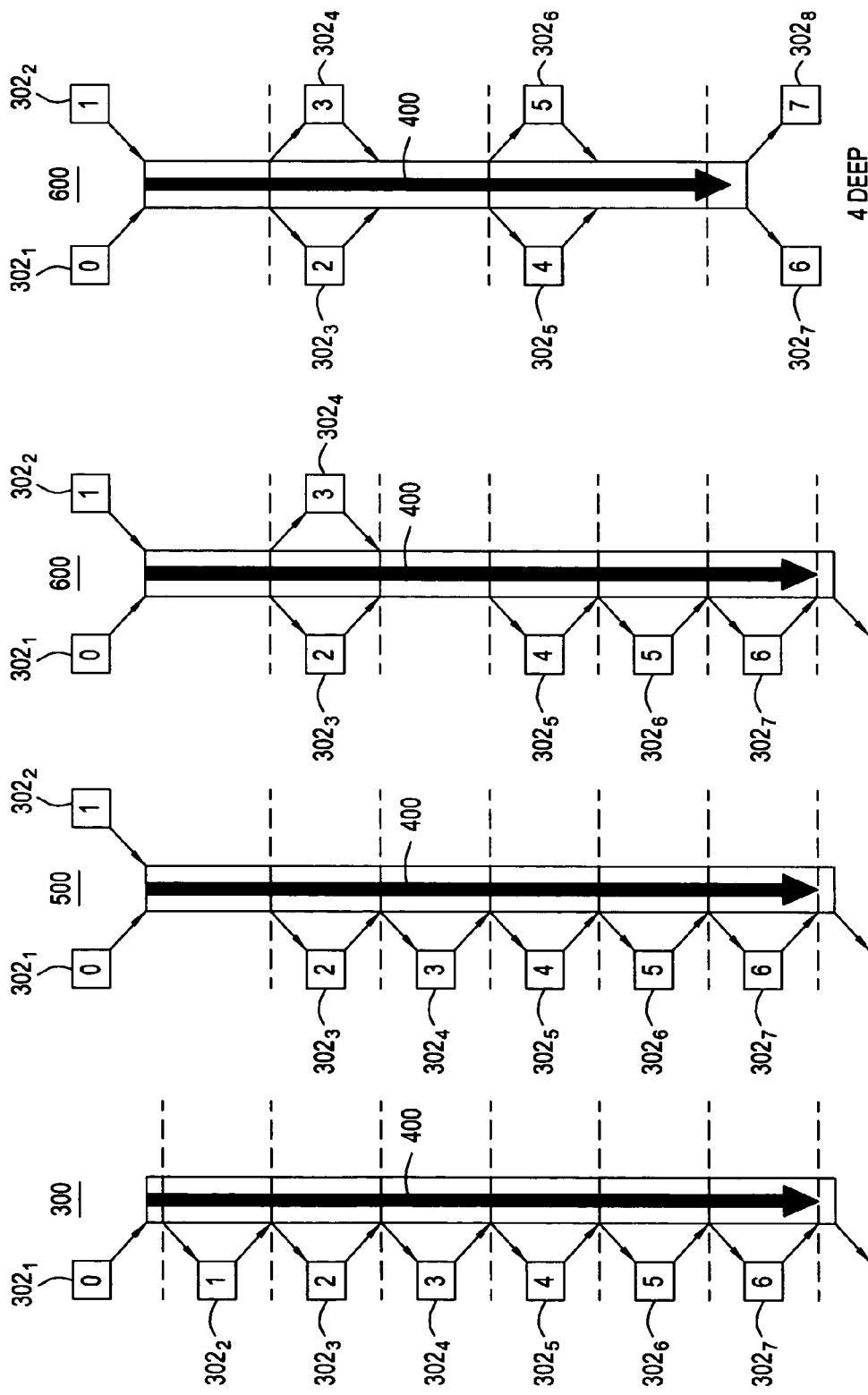

|    | INPUT A              | B             | C             | D |
|----|----------------------|---------------|---------------|---|
| P0 | M,P                  | b             | c             | d |
| P1 | M,P,(0)              | b             | c             | d |
| P2 | M,P,0,1              | b,0           | c             | d |
| P3 | M,P,0,1,(2)          | b,0           | c,(2)         | d |
| P4 | M,P,0,1,2,3          | b,0,1         | c,2,3         | d |
| P5 | M,P,0,1,2,3,(4)      | b,0,1,2       | c,2,3,(4)     | d |
| P6 | M,P,0,1,2,3,4,5      | b,0,1,2,3,4   | c,0,2,3,4     | d |
| P7 | M,P,0,1,2,3,4,5,(6)  | b,0,1,2,3,4   | c,0,2,3,4,(5) | d |

FIG. 8

METHOD AND APPARATUS FOR DESIGNING AN EMULATION CHIP USING A SELECTABLE FASTPATH TOPOLOGY

BACKGROUND OF THE INVENTION

1. Field of the Invention

Embodiments of the present invention generally relate to a hardware emulator, and more specifically, to a method and apparatus for designing a hardware emulation chip using a selectable fastpath topology.

2. Description of the Related Art

Hardware emulators are programmable devices used to verify hardware designs. A common method of hardware design verification is to use processor-based hardware emulators to emulate the design prior to physically manufacturing the integrated circuit(s) of the hardware. These processor-based emulators sequentially evaluate combinatorial logic levels, starting at the inputs and proceeding to the outputs. Each pass through the entire set of logic levels is known as a cycle; the evaluation of each individual logic level is known as an emulation step.

An exemplary hardware emulator is described in commonly assigned U.S. Pat. No. 6,618,698 titled "Clustered Processors In An Emulation Engine", which is hereby incorporated by reference in its entirety. Hardware emulators allow engineers and hardware designers to test and verify the operation of an integrated circuit, an entire board of integrated circuits, or an entire system without having to first physically fabricate the hardware.

The complexity and number of logic gates present on an integrated circuit has increased significantly in the past several years. Hardware emulators need to improve in efficiency to keep pace with the increased complexity of integrated circuits. The speed with which a hardware emulator can emulate an integrated circuit is one of the most important benchmarks of the emulator's efficiency, and also one of the emulator's most important selling factors in the emulator market.

Hardware emulators are comprised of processors. The processors are generally arranged into groups of processors known as clusters. Each processor performs an identical set of functions, i.e., retrieving data from a memory, evaluating the data, and writing the processed result back to the memory. The processors may compute results in series, i.e., an output of one processor functions as an input to another processor. Computing results in series increases the computational efficiency of the hardware emulator by reducing the number of emulation steps required to evaluate all of the data.

Originally, hardware emulators would perform a single function within a single processor at each step of an emulation cycle. As processor speed increased, the processors were configured to operate in groups (referred to as chains) such that the output of one processor is coupled to the input of another processor and the outputs of all foregoing processors in a chain are coupled to subsequent processors in the chain. These chains of processors perform a series of functions within one step of an emulation cycle. The number of processors operating sequentially in a chain is referred to as the depth and has been known to contain as many as eight levels. These chains of processors that operate together in a single step of an emulation cycle have come to be known as a "fastpath" and the arrangement of the processors with a fastpath is known as a fastpath topology.

When emulator designer's layout an emulator that uses fastpath, they must compute a maximum clock rate that enables the fastpath depth to be completely used during each emulation step, e.g., one clock cycle. Since the time required to utilize the entire depth and produce a result varies depending upon the propagation delays of signals, the layout of the processors, the temperature of the emulator, and so on, the task of determining the number of processors to use in a fastpath is difficult. If an emulator is designed to use a fastpath having an eight level depth, but, because of the current temperature of the emulator, the propagation delays have increased and the emulator can only complete seven of the eight functions that are required before the end of the step, the emulation performed is useless and becomes unpredictable.

As such, emulator designers must predict the maximum depth that an emulator can handle. If the prediction is incorrect, as determined by chip design verification, the emulator layout must be reconfigured at great cost. For example, if it is found that certain fastpaths are too slow to utilize an eight level depth, the emulator requires the layout to be reconfigured to trim the depth to a depth that is functional, e.g., seven or six sequential processors. Such redesign is very time consuming and costly.

Therefore, there is a need in the art for a method and apparatus for reorganizing a fastpath topology without performing extensive layout redesign.

SUMMARY OF THE INVENTION

The present invention generally relates to a method and apparatus for designing a processor-based emulation integrated circuit (chip) having a selectable fastpath topology. Included are initially designing an N-level fastpath topology comprising a plurality of processors, then reducing the N-level fastpath topology to an M-level topology such that the performance of the topology meets a design criterion, e.g., capable of evaluating data during a time of an emulation step. In this manner, an emulator chip designer may configure the fastpath topologies without extensive redesign of the chip layout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4, 5, 6, and 7 are diagrams depicting several selectable fastpath topologies; and FIG. 8 depicts a chart of data-to-processor assignment for one embodiment of the invention.

DETAILED DESCRIPTION

The present invention is a method and apparatus for designing an emulation integrated circuit (chip) using selectable fastpath topologies. During emulation chip design, a designer creates fastpath topologies having a maximum depth of N levels. Ideally, a designer would like to have each processor have visibility to outputs of all other processors. However, for practical reasons, the visibility to other processors is limited. As such, a fastpath topology comprises a plurality of processors arranged from a subset of the available processors. Upon performing a timing analysis upon a synthesized chip design, the designer uses the present invention to optimize the fastpath topology and rapidly edit at least one fastpath topology to comply with a timing constraint such that the edited fastpath has a depth of M levels, where N and M are integers and M is less than N. The fastpath edit is performed by removing of a processor input connection, e.g., disconnecting one input of an input multiplexer. Although all processors of the original N levels (e.g., N processors) are present and can be used during an emulation, only M processors form distinct levels of the fastpath. In this manner, the emulation chip design is rapidly brought into compliance with the timing constraint without any significant layout changes.

Figure 1:
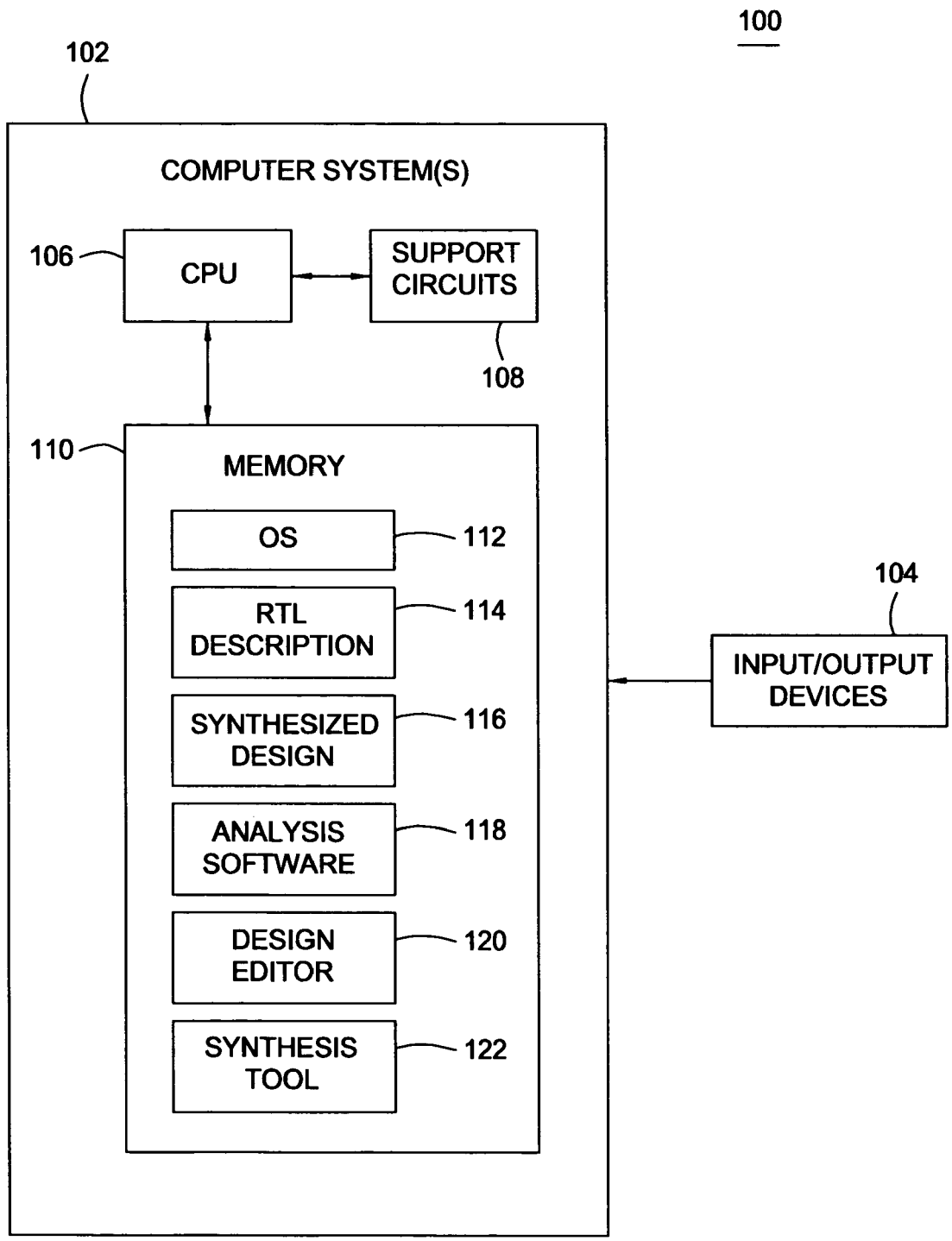
FIG. 1 depicts a block diagram of an integrated circuit design system that utilizes one embodiment of the present invention.

FIG. 1 depicts a block diagram of an emulation chip design system 100 comprising a computer system 102 and input/output devices 104. Although, for simplicity, the system 100 is depicted as comprising a single computer system 102, many chip design system comprise a number of sub-systems and stations for performing various design functions. The stations or computers may be connected to one another via a network.

The computer system 102 comprises at least one central processing unit (CPU) 106, support circuits 108, and memory 110. The CPU 106 comprises one or more readily available microprocessors and/or microcontrollers. The support circuits 108 comprise various, well-known circuits that facilitate the operation of the CPU 106. Such support circuits include, but are not limited to, cache, power supplies, clock circuits, buses, network cards, input/output interface cards, graphics cards, and the like.

The memory 110 may comprise random access memory, read only memory, disk drives, optical memory, removable memory, and combination thereof. The memory 110 stores executable software and data including an operating system (OS) 112, an RTL description 114 of the chip design, a synthesized chip design 116, analysis (verification) software 118, a design editor 120, and a synthesis tool 122. A practical emulation chip design system may contain other software, subsystems and hardware that is well-known in the art. For simplicity, the software and data described herein are related to the use of fastpath topologies and the editing thereof.

The input/output devices 108 include well-known devices such as a keyboard, trackball, monitor, printer, and the like. Vis these devices, a chip designer can review and edit the fastpath topologies in accordance with the invention.

Figure 2:
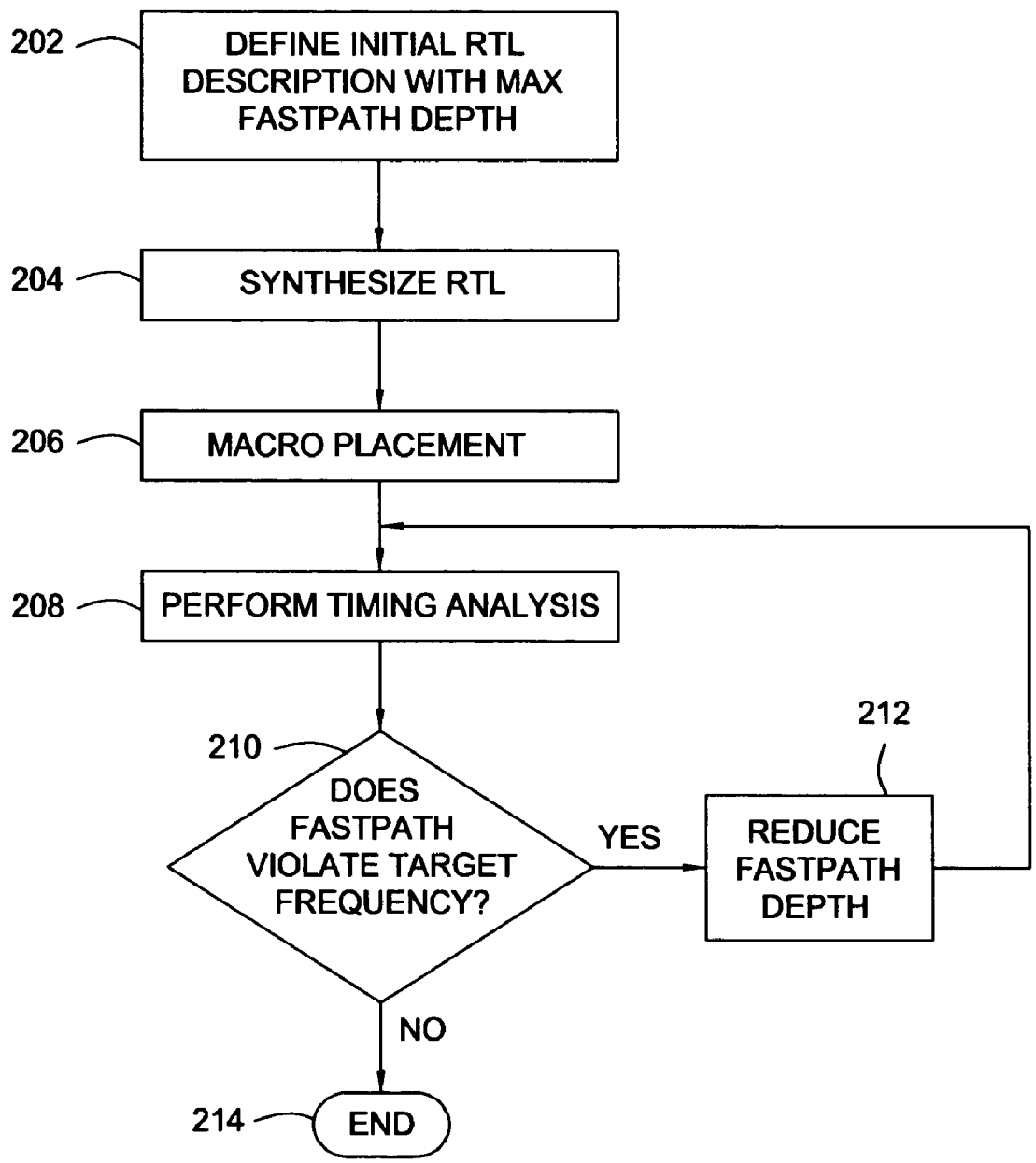
FIG. 2 depicts a flow diagram of a method for editing a fastpath depth in accordance with one embodiment of the present invention.

FIG. 2 depicts a flow diagram of a method 200 of operation of one embodiment of the present invention. The method 200 represents the processes that are performed during emulation chip design executing the software of FIG. 1. The method 200 begins, at block 202, with a designer creating a register transfer level (RTL) description of the emulation chip, where the description comprises a maximum fastpath depth. As such, if the design is expected to support an N-level depth, where within each step of the emulation cycle all N-levels are expected to be utilized, the RTL description will have that maximum depth for the fastpath topologies defined therein. Typically, the N-level depth will comprise N-processors connected in series to form the initial fastpath topology.

At block 204, in a well-known manner, the synthesis tool 122 is executed to synthesize a chip design from the RTL. At block 206, macro placement is performed to complete the chip design. At block 208, the chip design is verified, where one portion of the verification process performs a static timing analysis using the analysis software 118. The static timing analysis identifies fastpath topologies that violate the target frequency i.e., those topologies that require a longer time to complete than the target time allows.

At block 210, the method 200 queries, for each fastpath topology, whether the topology violates the target frequency. For example, if the target frequency is 500 MHz, then each step in the emulation cycle must complete within 2 nS. If the timing analysis shows that a particular fastpath topology is not able to complete in the required time, the method 200 proceeds to block 212 where the design editor 120 is used to alter the design shorten the fastpath topology. When all the topologies can be completed using the target frequency, the method 200 ends at block 214. The emulation chip design is now ready for physical layout.

As shall be described below in detail, the fastpath topologies are initially arranged such that the output of each processor within a topology is routed to an input of another processor within the topology. The inputs of the processors comprise multiplexers that are configured during the emulator design process to accept a specific number of physical inputs from various data sources. The input configuration is discussed in detail with reference to FIG. 8 below. The editing process disconnects an appropriate input path within the chain to shorten the topology to a depth that can complete processing within the allotted time. Although the topology depth is decreased, all the processors are still available for use in the emulator. To shorten a path, the RTL may be altered to "zero" an input or a smaller multiplexer at the processor input may be used. In either case, the design alteration is relatively minor.

Figure 3:
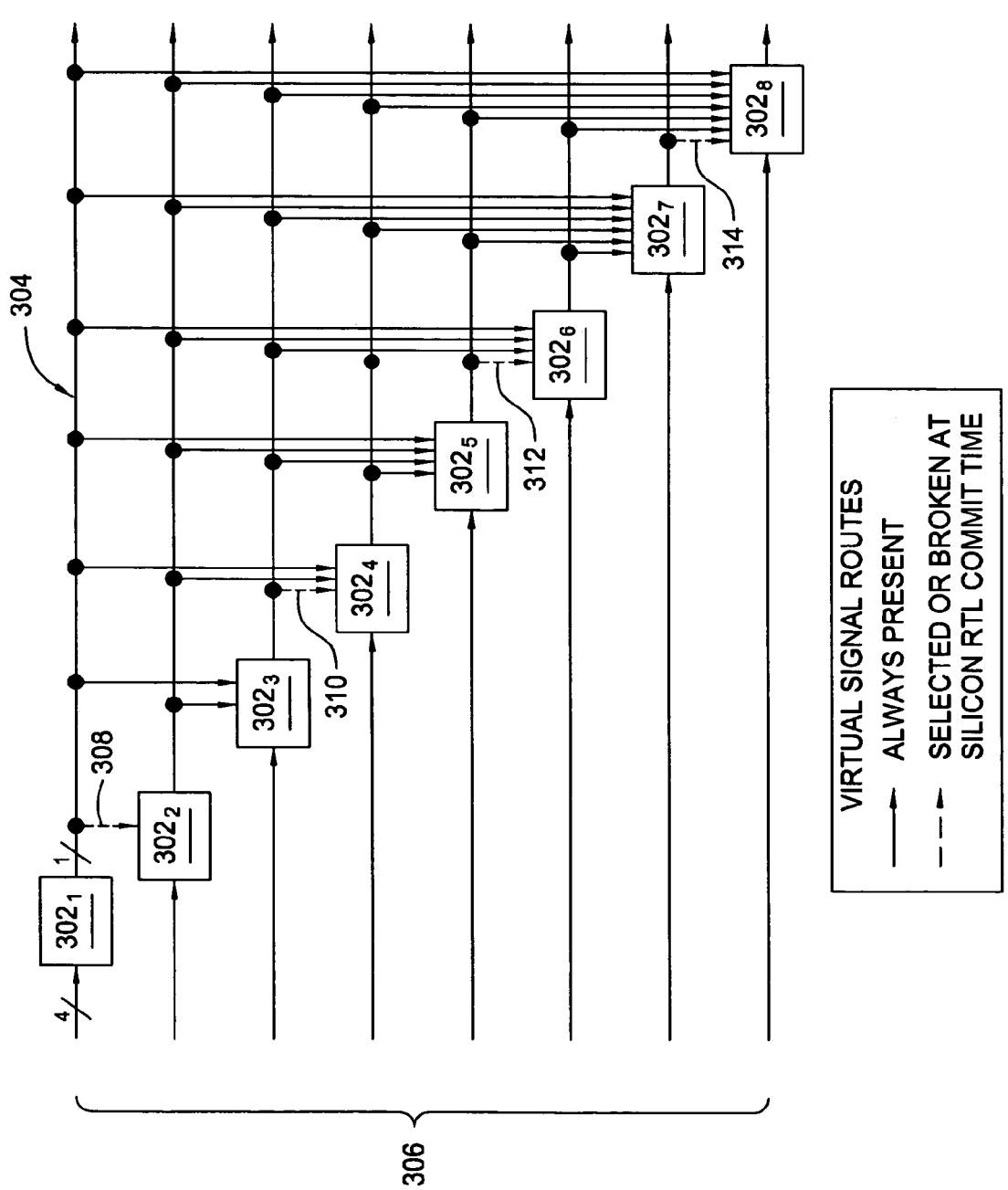
FIG. 3 is a relational diagram of signal paths between processors within a fastpath topology.

FIG. 3 is simplified diagram of a selectable fastpath topology. The maximum depth (N) of the fastpath topology 300 is, for example, eight. For this example, it is assumed that the maximum depth (N) is eight; however, depending upon the design, the topology may be shallower or deeper than eight. The eight level deep topology 300 comprises processors $302_1$ to $302_8$. The output of the processors 302 are interconnected by wiring matrix 304. During operation, other input data to be processed by each processor is supplied on paths 306. The output of any processor 302 is available as an input to any "lower" processor 302 within the topology 300, i.e., all output signals are fed forward. For example, processor $302_1$ is available to every other processor $302_{2-8}$, while the output of processor $302_2$ is to all lower processors $302_{3-8}$, and so on.

Each processor 302 (except processor $302_1$) processes input data from paths 306 and from other processors 302 to generate output data. Processor $302_1$ processes data from input path 306 only. Each processor 302 can provide output data as input data to any subsequent processor within the eight level deep topology 300, e.g., processor $302_1$ can provide input data to processors $302_2$ to $302_8$.

Once a maximum depth topology is shown to exceed the allotted time constraint, the depth of the topology is reduced. The depth of the topology 300 can be modified by preventing certain processors 302 from providing input data to subsequent processors 302. In essence, the series nature of the connection is altered to configure some of the processors in parallel rather than series. The dashed lines represent data paths between processors 302 that can be selected or broken to modify the fastpath topology. For example, a dashed line (path 308) is shown between processors $302_1$ and $302_2$. If the data path 308 between processors $302_1$ and $302_2$ is disconnected, then the topology is modified to a seven-level deep topology i.e., processors $302_1$ and $302_2$ are no longer in series, they are coupled in parallel to processor $302_3$. Thus, by editing the input connection between processors the N-level depth topology is configured into a M-level depth topology, where M is less than N. Removing the connection between the first two processors forms a topology where M=N−1. In one embodiment of the invention, the inputs of a processor comprises a multiplexer $350_{1-8}$ that is used to select an input signal for processing. To facilitate disconnecting an input, an input to an input multiplexer $350_{1-8}$ can be removed or "zeroed".

Similarly, disconnection of paths 308 and 310 forms a topology of depth six (i.e., N−2), disconnection of paths 308, 310 and 312 forms a topology of depth five (i.e., N−3) and disconnection of paths 308, 310, 312 and 314 forms a topology of depth four (i.e., N−4). Note that the embodiment depicts every other output as selectable. In other embodiments of the invention, every output may be selectable to provide further flexibility to the emulation chip designer.

It should be understood that the use of static timing analysis is only one example of a measurement technique to measure timing compliance for the emulation chip design. Also, timing compliance is only one type of criteria used to determine whether the depth of a topology requires reduction or trimming. Other criterion or combinations of criterion may be used.

FIGS. 4, 5, 6 and 7 depict several possible exemplary fastpath topologies that may be created by editing a N-level topology, where N is eight. One skilled in the art will appreciate that these are not the only possible fastpath topologies available, and that available topologies will depend upon the number of processors 302 used in the design.

FIG. 4 depicts an eight level deep topology 300. For this example, it is assumed that the maximum depth (N) is eight. The eight level deep topology comprises processors $302_1$ to $302_8$, where, the output of any processor 302 is available as an input to any subsequent processor 302. The large arrow 400 represents that the output of any on processor is available to every "lower" processor i.e., the arrow 400 is a representation of the wiring matrix 304 of FIG. 3. For example, processor $302_1$ is available to every other processor $302_{2-8}$, while the output of processor $302_2$ is to all lower processors $302_{3-8}$, and so on.

As shown in FIG. 5, if a designer removes the connection 308 between $302_1$ and $302_2$, the topology becomes a seven level deep topology 500. The output of the first processor $302_1$ is not available as an input to the second processor $302_2$, i.e., processors $302_1$ and $302_2$ are now in parallel and form a single level of the topology. The outputs of the first and second processors $302_1$ and $302_2$ are available to all subsequent processors $302_3/302_4/302_5/302_6/302_7/302_8$. Any processor 302 within the seven level topology 400 can receive input from any previous processor 302, e.g., processor $302_4$ can receive input from processors $302_1/302_2/302_3$. By reducing the depth of the topology, the function performed by the fastpath topology is completed more quickly than the eight level deep topology.

FIG. 6 depicts a six level deep topology 600. The output of the first processor $302_1$ is not available as an input the second processor $302_2$. The outputs of the first and second processors $302_1$ and $302_2$ are available as inputs to the third processor $302_3$ and to the fourth processor $302_4$. However, the output of the third processor $302_3$ is not available as an input to the fourth processor $302_4$, i.e. processors $302_3$ and $302_4$ form a level. The outputs of the first, second, third and fourth processors $302_1$, $302_2$, $302_3$, and $302_4$ respectively are available to all subsequent processors, i.e., the fifth, sixth, seventh and eight processors $302_5/302_6/302_7/302_8$. As such, only six levels of signal propagation occur. There are still eight processors, but they are configured to have a topology that will complete processing within six levels.

FIG. 7 depicts a four level deep topology 700. The output of the first processor $302_1$ is not available as an input to the second processor $302_2$. The outputs of the first and second processors $302_1$ and $302_2$ are available as inputs to the third processor $302_3$ and to the fourth processor $302_4$. However, the output of the third processor $302_3$ is not available as an input to the fourth processor $302_4$. The outputs of the first, second, third and fourth processors $302_1$, $302_2$, $302_3$, and $302_4$ respectively are available to all subsequent processors, i.e., the fifth, sixth, seventh and eight processors $302_5/302_6/302_7/302_8$. However, the output of the fifth processor $302_5$ is not available as an input to the sixth processor $302_6$, i.e., processors $302_5$ and $302_6$ form a level. Nor is the output of the seventh processor $302_7$ available as an input to the eighth processor $302_8$, i.e., processors $302_7$ and $302_8$ form a level. The outputs of the fifth processor $302_5$ and the sixth processor $302_6$ are available to the seventh processor $302_7$ and the eighth processor $302_8$ as an input. Each of the processors 302 within the four level deep topology 608 can receive input from a prior processor 302, e.g., processor $302_3$ can receive input from processor $302_1$, and can provide input to any subsequent processor, e.g., processor $302_3$ can provide input to processor $302_5$.

FIG. 8 depicts a chart 800 of data source-to-processor assignments for one embodiment of the invention. A given processor has four physical inputs A, B, C and D. In this embodiment, eight processors P0 through P7 are available for use in a fastpath. Ideally, each processor in the sequence should have visibility to the outputs of all prior processors. However, for timing and other practical purposes each processor has visibility to three prior processors. This visibility is designed by using multiplexers at three inputs of the four-input processors, e.g., three of the four inputs comprise multiplexers to enable these inputs to see data from three previous processors. The selection of which processor outputs are available at each input is made such that for any selection of three previous processor outputs to be used, there is an arrangement of the inputs that allows access to those outputs. Since rearranging the inputs to processors does not impair what functions can be performed by that processor, this achieves the goal of allowing access to the outputs of any three previous processors.

For example, processor P0 has input A coupled to both M and P data sources via a multiplexer (e.g., multiplexer $350_{1-8}$ of FIG. 3). M and P sources are memory and external data sources that are irrelevant to the present invention. Data bits b, c, and d are bits supplied by the data array to inputs B, C and D. Note that every processor has visibility of the M and P sources as well as the data array bits b, c and d.

Processor P1 has input A coupled through a multiplexer to sources M, P and the P0 output bit identified as "0". The brackets around ")", i.e., (0), indicate that this connection may be deleted to alter the depth of the fastpath. Without the (0) connection, processor P0 and P1 have identical ("parallel") input choices, i.e., FIG. 5.

Processor P2 may have input A coupled to sources M, P, P0 output or P1 output. Input B is coupled to the data array (b bit) and the P0 output. Input C and D are coupled to the data array.

Inputs in the brackets (i.e., (0), (2), (4), (6)) at processors P1, P3, P5 and P7 may be removed (disconnected) to alter the depth of the fastpath to ensure that timing and other design constraints are met. The result of the path removal creates the topologies of FIGS. 4-7.

Once an emulator chip is designed in this manner, the emulation uses any of the available processor inputs to facilitate the needs of the emulation. Since the fastpaths have been designed to meet the timing limits of the emulator chip, the emulation is ensured not to cause a timing violation while using a given fastpath topology. The emulation program may be compiled to utilize any of the fastpath processors and their various inputs.

Thus, the present invention provides the advantage of allowing an emulation chip designer to create a fastpath topology that complies with design constraints of the emulation chip, i.e., the frequency limitations of the emulation chip. Deeper fastpath topologies increase the efficiency of a processor-based emulation system because the processors can utilize output data provided by another processor to compute a result without having to retrieve data from a data array. However, the deeper a topology, the slower the computation. If a timing analysis of the emulation chip indicates that certain topologies cannot complete within the allotted time, the designer can easily edit the design by disconnecting inputs to selected ones of the processors in the topology. In this manner, the topology can be made compliant with the timing constraints without requiring extensive chip layout redesign. Users of the chip for performing emulations are assured that the available fastpath topology will function without a timing fault.

While the foregoing is directed to embodiments of the present invention, other and further embodiments of the invention may be devised without departing from the basic scope thereof, and the scope thereof is determined by the claims that follow.

What is claimed is:

1. A computer-implemented method for designing an emulation chip using a selectable fastpath topology, comprising:
   determining, from a circuit design for the emulation chip, an initial fastpath topology comprising a plurality of processors connected in series such that each of the plurality of processors is one of N levels of the initial fastpath topology, N being an integer greater than one; and
   reducing, using a computer to process the circuit design, the initial fastpath topology from the N-levels to M-levels, where M is an integer greater than zero and less than N, by changing at least one connection among the plurality of processors such that M processors of the plurality of processors are connected in series and N−M processors of the plurality processors are connected in parallel.

2. The method of claim 1 wherein, the reducing is performed in response to at least one design criterion.

3. The method of claim 2, wherein the design criteria comprises an ability to evaluate data using all of the plurality of processors during a duration of one emulation step of an emulation cycle.

4. The method of claim 1, wherein the reducing further comprises disconnecting a path from an output of at least one of the N−M processors to an input of at least one of the M processors.

5. The method of claim 1, further comprising:
   performing a static timing analysis of the circuit design; and
   performing the reducing in response to the static timing analysis indicating that the initial fastpath topology having the N levels cannot be performed within an emulation step of an emulation cycle.

6. The method of claim 1, wherein the initial fastpath topology comprises:
   a first processor of the plurality of processors having an output coupled to an input of each of N−1 processors of the plurality of processors;
   a second processor of the plurality of processors having an output coupled to an input of each of N−2 processors of the plurality of processors, and not connected to an input of the first processor;
   a third processor of the plurality of processors having an output connected to an input of each of N−3 processors of the plurality of processors, and not connected to an input of the first or second processor.

7. The method of claim 6, wherein the reducing further comprises:
   disconnecting a connection between the output of the first processor and the input of the second processor.

8. The method of claim 7, wherein the disconnecting comprises removal of a multiplexer input in the second processor.

9. A computer-implemented method of designing an emulation chip, comprising:
   generating, using a computer, an RTL description of the emulation chip, where the RTL description contains an initial fastpath topology having a plurality of processors connected in series such that each of the plurality of processors is one of N levels of the initial fastpath topology, N being an integer greater than one;
   synthesizing the RTL description;
   performing a design analysis to determine whether the initial fastpath topology is compliant with at least one design criterion; and
   reducing, in response to the initial fastpath topology not being compliant with the at least one design criterion, the initial fastpath topology from the N-levels to M-levels, where M is an integer greater than zero and less than N, by changing at least one connection among the plurality of processors such that M processors of the plurality of processors are connected in series and N−M processors of the plurality processors are connected in parallel.

10. The method of claim 9, wherein the design analysis comprises a static timing analysis.

11. The method of claim 10, wherein the at least one design criterion requires that all of the plurality of processors perform data evaluation within one step of an emulation cycle.

12. The method of claim 9, wherein the reducing further comprises:
   disconnecting a connection between an output of at least one processor of the plurality of processors and the input of at least one other processor of the plurality of processors to change a serial connection into a parallel connection.

13. The method of claim 12, wherein disconnecting comprises removal of a multiplexer input.

14. Apparatus for designing an emulation chip, comprising:
   means for determining, from a circuit design for the emulation chip, an initial fastpath topology comprising a plurality of processors connected in series such that each of the plurality of processors is one of N levels of the initial fastpath topology, N being an integer greater than one; and
   means for reducing the initial fastpath topology from the N-levels to M-levels, where M is an integer greater than zero and less than N, by changing at least one connection among the plurality of processors such that M processors of the plurality of processors are connected in series and N−M processors of the plurality processors are connected in parallel.

15. The apparatus of claim 14, wherein the means for reducing changes a series arrangement of at least two processors of the plurality of processors into a parallel arrangement.

16. The apparatus of claim 14, wherein the means for reducing reduces the initial fastpath topology in response to a design criterion.

17. The apparatus of claim 16, wherein the design criterion comprises an ability of the plurality of processors to evaluate data within one step of an emulation cycle.

18. The apparatus of claim 14, wherein each processor of the plurality of processors comprises an input multiplexer and said means for reducing changes the at least one connection by removing an input to the input multiplexer of at least one processor in the plurality of processors.

\* \* \* \* \*